(12) United States Patent
Zhou

(10) Patent No.: US 11,271,088 B2
(45) Date of Patent: Mar. 8, 2022

(54) SEMICONDUCTOR STRUCTURE WITH PROTECTION LAYER

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/895,060

(22) Filed: Jun. 8, 2020

(65) Prior Publication Data

US 2020/0303515 A1 Sep. 24, 2020

Related U.S. Application Data

(62) Division of application No. 16/105,562, filed on Aug. 20, 2018, now Pat. No. 10,714,590.

(30) Foreign Application Priority Data

Aug. 22, 2017 (CN) .......................... 201710726800.5

(51) Int. Cl.
*H01L 29/78* (2006.01)
*H01L 29/66* (2006.01)
(Continued)

(52) U.S. Cl.
CPC ........ *H01L 29/66492* (2013.01); *B82Y 10/00* (2013.01); *H01L 21/26513* (2013.01);
(Continued)

(58) Field of Classification Search
CPC ......... H01L 29/66492; H01L 29/78696; H01L 29/7848; H01L 29/775; H01L 29/66439; H01L 29/41725; H01L 29/0673; H01L 29/66742; H01L 29/42392; H01L 21/31144; H01L 21/26513; H01L 29/66545; H01L 29/165; H01L 29/66795; H01L 29/785; B82Y 10/00
See application file for complete search history.

(56) References Cited

U.S. PATENT DOCUMENTS 9,660,033 B1    5/2017  Chen et al.
10,020,398 B1*  7/2018  Cheng ................. H01L 29/0673
(Continued)

*Primary Examiner* — Bilkis Jahan
(74) *Attorney, Agent, or Firm* — Anova Law Group, PLLC

(57) ABSTRACT

Semiconductor structure is provided. The semiconductor structure includes at least one fin on a semiconductor substrate; at least one stacked channel layer formed on the at least one fin, each stacked channel layer having a sacrificial layer and a channel layer on the sacrificial layer; a dummy gate structure formed on the dummy gate structure; openings formed in the at least one stacked channel layer at both sides of the dummy gate structure; and a protective layer formed on sidewall surfaces of the sacrificial layer.

13 Claims, 7 Drawing Sheets

(51) Int. Cl.
  *H01L 29/423* (2006.01)
  *H01L 21/311* (2006.01)
  *H01L 21/265* (2006.01)
  *H01L 29/786* (2006.01)
  *H01L 29/775* (2006.01)
  *H01L 29/417* (2006.01)
  *H01L 29/06* (2006.01)
  *B82Y 10/00* (2011.01)
  *H01L 29/165* (2006.01)

(52) U.S. Cl.
  CPC .... *H01L 21/31144* (2013.01); *H01L 29/0673* (2013.01); *H01L 29/41725* (2013.01); *H01L 29/42392* (2013.01); *H01L 29/66439* (2013.01); *H01L 29/66545* (2013.01); *H01L 29/66742* (2013.01); *H01L 29/775* (2013.01); *H01L 29/7848* (2013.01); *H01L 29/78696* (2013.01); *H01L 29/165* (2013.01)

(56) References Cited

U.S. PATENT DOCUMENTS

| | | |
|---|---|---|
| 2008/0064173 A1 | 3/2008 | Hung |
| 2014/0001441 A1* | 1/2014 | Kim .................. H01L 29/66553 257/29 |
| 2017/0069763 A1 | 3/2017 | Doris et al. |
| 2017/0194430 A1 | 7/2017 | Wood et al. |
| 2018/0047853 A1* | 2/2018 | Chang ............... H01L 29/42392 |
| 2018/0323195 A1* | 11/2018 | Mehandru ........... H01L 21/8221 |

* cited by examiner

SEMICONDUCTOR STRUCTURE WITH PROTECTION LAYER

CROSS-REFERENCES TO RELATED APPLICATIONS

This application is a divisional of U.S. patent application Ser. No. 16/105,562, filed on Aug. 20, 2018, which claims the priority of Chinese patent application No. 201710726800.5, filed on Aug. 22, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the repaid development of semiconductor manufacturing technologies, semiconductor devices have been developed toward higher device density and higher integration level. Transistors, as basic semiconductor devices, have been widely used. With the continuous increase of the device density and integration level, the channel length of a transistor has been continuously reduced. With the continuous reduction of the channel length of the transistor, the distance between the source and the drain of the transistor has been continuously reduced. Thus, the control ability of the gate of the transistor on the channel of the transistor has become weaker and weaker. Correspondingly, the sub-threshold leakage, i.e., the short-channel effect (SCE), is easy to occur; and the channel leakage current of the transistor is increased.

Thus, to better adapt the requirements for the miniaturization of semiconductor devices, semiconductor technologies have been gradually transferred from planar transistors to three-dimensional (3D) transistors which have better performance. A gate-all-around (GAA) transistor is one of the typical 3D transistors. In the GAA transistor, the gate surrounds all around the region having the channel. Comparing with a planar transistor, the control ability of the gate of the GAA transistor on the channel is greater; and the SCE of the transistor is better suppressed.

On the other hand, to increase the carrier mobility of the channel of a transistor, a stress layer is introduced to form the source region and the drain region of the transistor. By using the crystal lattice mismatch between the stress layer material and the channel material, the stress layer is able to apply a compressive stress or a tensile stress to the channel region of the transistor. Thus, the performance of the transistor is improved.

However, when the GAA structure is introduced into the transistor having the stress layer, the stress layer may be easily damaged. Accordingly, the performance of the semiconductor structure may be degraded. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having at least one fin; forming a stacked channel layer having at least one sacrificial layer on the fin and a channel layer on the sacrificial layer; forming a dummy gate structure on the stacked channel layer; forming openings in the stacked channel layer at both sides of the dummy gate structure; removing portions of the sacrificial layer under the dummy gate structure to form grooves on sidewall surfaces of the openings; and forming a protective layer in the grooves.

Another aspect of the present disclosure includes a semiconductor structure. The semiconductor structure includes at least one fin on a semiconductor substrate; a stacked channel layer formed on the at least one fin; a dummy gate structure formed on the stacked channel layer; openings formed in the stacked channel layer at both sides of the dummy gate structure; and a protective layer formed on sidewall surfaces of the sacrificial layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-4 illustrate structures corresponding to certain stages when forming a semiconductor structure.

Figure 1:
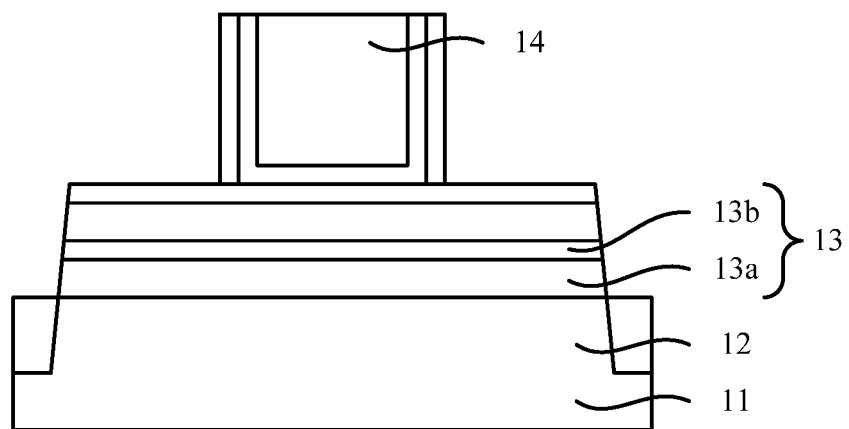
FIGS. 1-4 illustrate structures corresponding to certain stages when forming a semiconductor structure.

As shown in FIG. 1, the method for forming the semiconductor structure include providing a semiconductor substrate 11. A fin 12 is formed on the semiconductor substrate 11; and a stacked channel layer 13 is formed on the fin 12. The stacked channel layer 13 includes a sacrificial layer 13*a* and a channel layer 13*b* on the sacrificial layer 13*a*. A dummy gate structure 14 is formed on the fin 12 and the stacked channel layer 13.

Figure 2:
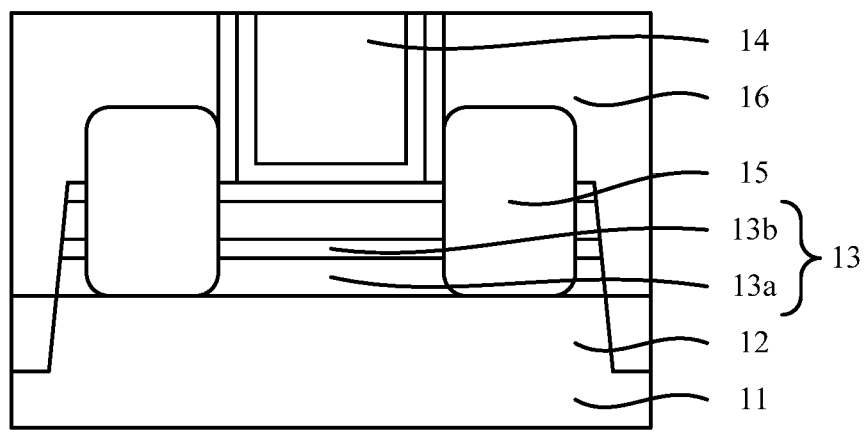

Further, as shown in FIG. 2, the method includes forming a doped stress layer 15 in the stacked channel layer 13 at both sides of the dummy gate structure 12; and forming an interlayer dielectric layer 16 on the semiconductor substrate 11. The interlayer dielectric layer 16 exposes the top surface of the dummy gate structure 14.

Figure 3:
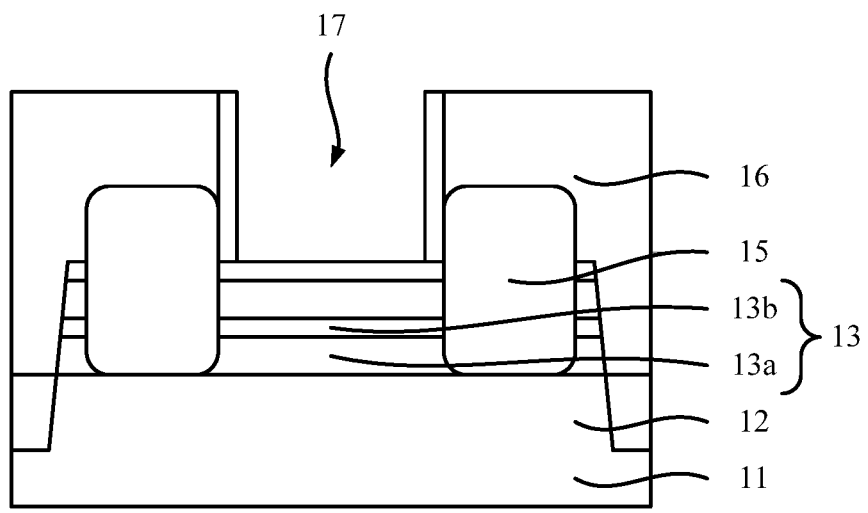

Further, as shown in FIG. 3, the method includes removing the dummy gate structure 14 (as shown in FIG. 2) to form a gate opening 17. The gate opening 17 exposes a portion of the top surface and portions sidewall surfaces of the stacked channel layer 13.

Figure 4:
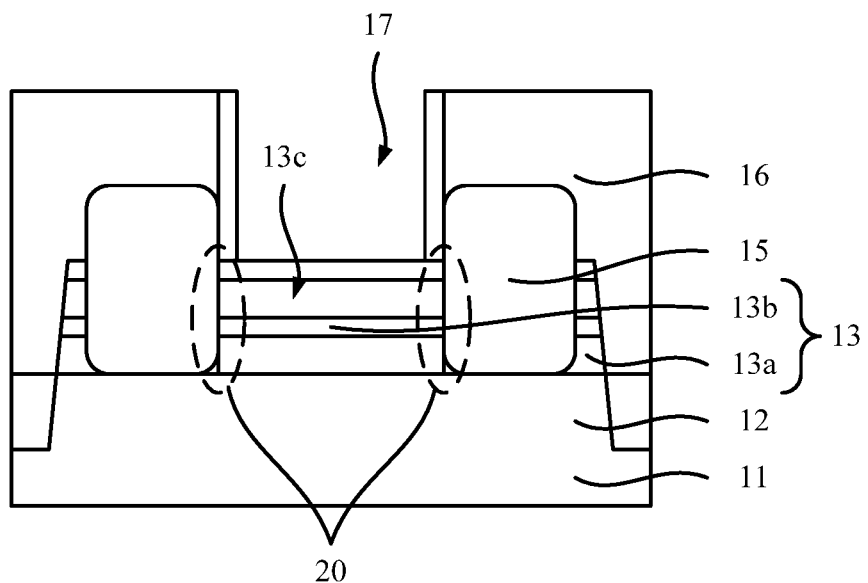

Further, as shown in FIG. 4, the method includes etching the sacrificial layer 13*a* exposed by the gate opening 12 to form a gap 13*c* under the stacked channel layer 13.

Referring to FIG. 2, because the doped stress layer 15 is formed in stacked channel layer 13 and the fin 12 at both sides of the dummy gate structure 14, the doped stress layer 15 directly contacts with the sidewalls of the stacked channel layer 13. That is, the sidewall of the doped stress layer 15 directly contacts with the sidewall of the sacrificial layer 13a and the sidewall of the channel layer 13b. Further, referring to FIG. 4, when removing the sacrificial layer 13a exposed by the gate opening 17 and after removing the sacrificial layer 13a, the sidewall surfaces of the stress layer 15 (as shown in the circles 20 in FIG. 4) are exposed in the gate opening 17. Thus, the possibility for damaging the stress layer 15 is increased; and the performance of the semiconductor structure is affected.

Further, to obtain the channel layer 13b with a desired quality and prevent the channel layer 13b from being damaged when removing the sacrificial layer 13a, the material of the channel layer 13b is often made of Si and the sacrificial layer 13a is often made of SiGe. Thus, when the semiconductor structure is a PMOS transistor, the stress layer 15 is often made of SiGe. Accordingly, the process for removing the sacrificial layer 13a is not easy to be precisely stopped at the interface between the sacrificial layer 13a and the stress layer 15; and the stress layer 15 may be damaged during the process of removing the sacrificial layer 13a. Thus, the performance of the semiconductor structure may be degraded.

The present disclosure provides a semiconductor structure and a method for fabricating a semiconductor structure. In the method, a protective layer may be formed between the sacrificial layer and the stress layer so as to prevent the stress layer from being damaged when removing the sacrificial layer and reduce the possibility for damaging the stress layer. Thus, the quality of the stress layer may be improved; and the performance of the semiconductor structure may be improved.

Figure 15:
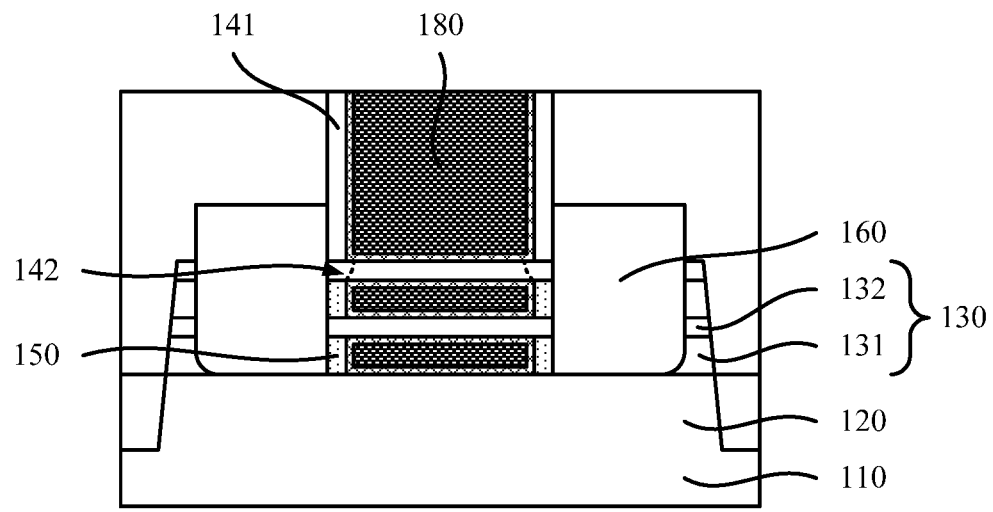
Figure 16:
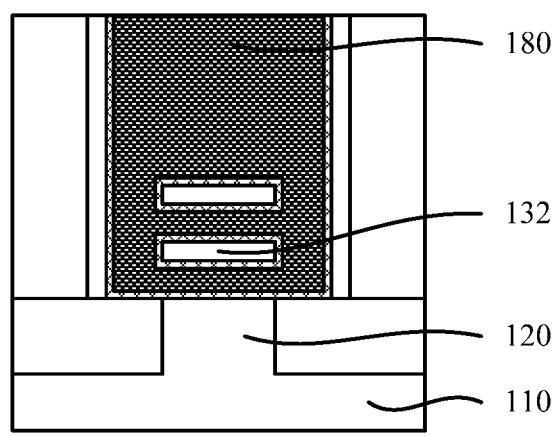
Figure 17:
FIG. 17 illustrates an exemplary fabrication process of a semiconductor structure consistent with various disclosed embodiments.

FIG. 17 illustrates an exemplary fabrication process of a semiconductor structure consistent with various disclosed embodiments. FIGS. 5-16 illustrate structures corresponding to certain stages during the exemplary fabrication process.

Figure 5:
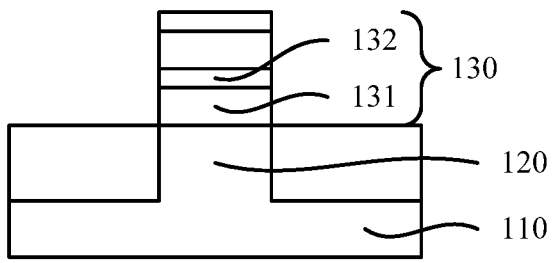
FIGS. 5-16 illustrate structures corresponding to certain stages during a fabrication process of an exemplary semiconductor structure consistent with various disclosed embodiments.

As shown in FIG. 18, at the beginning of the fabrication process, a semiconductor substrate with certain structures is provided (S101). FIG. 5 illustrates a corresponding semiconductor structure.

As shown in FIG. 5, a semiconductor substrate 110 is provided. At least one fin 120 is formed on the semiconductor substrate 110. Further, a stacked channel layer 130 may be formed on the fin 120. The stacked channel layer 130 may include a sacrificial layer 131 on the fin 120 and a channel layer 132 on the sacrificial layer 131.

The semiconductor substrate 110 and the fin 120 provide a process platform for subsequently forming the semiconductor structure. The stacked channel layer 130 may provide a process base for subsequently forming a suspended channel layer. The sacrificial layer 131 may provide a spatial space for subsequently forming an all-around gate structure. The channel of the semiconductor structure may be formed in the channel layer 132.

In one embodiment, the semiconductor structure may be a PMOS transistor. In some embodiments, the semiconductor structure may be an NMOS transistor.

In one embodiment, the semiconductor substrate 110 is made of single crystal silicon. In some embodiments, the semiconductor substrate may be made of polysilicon, amorphous silicon, amorphous germanium, germanium, silicon germanium, silicon carbide, gallium arsenide, or gallium indium, etc. In other embodiments, the semiconductor substrate may be a silicon on insulator (SOI) substrate, a germanium on insulator (GOI) substrate, or a glass substrate, etc. The material of the semiconductor substrate may be a material that meets the process requirements and is easy to be integrated.

In one embodiment, the fin 120 and the semiconductor substrate 111 are made of a same material, for example, single crystal silicon. In some embodiments, the fin and the semiconductor substrate may be made of different materials. The fin may be made of other appropriate semiconductor material, such as silicon, germanium, silicon germanium, or silicon carbide, gallium arsenide, or gallium indium, etc.

The sacrificial layer 131 may be made of any appropriate material. In one embodiment, the sacrificial layer 131 is made of SiGe; and the channel layer 132 may be made of SiGe. Because the etching selectivity ratio between Si and SiGe may be substantially large, the damage to the channel layer 132 when subsequently removing the sacrificial layer 132 may be effectively reduced. Accordingly, the performance of the semiconductor structure may be improved.

In one embodiment, referring to FIG. 5, two stacked channel layers 130 may be formed on the fin 120. That is, two sacrificial layers 131 and two channel layers 132 may be alternatively formed on the fin 120, although any number of the stacked channel layers may be encompassed within the scope of the present disclosure.

In one embodiment, the semiconductor substrate 110, the fin 120 and the stacked channel layer 130 may be formed by a same single process. The process for forming the semiconductor substrate 110, the fin 120 and the stacked channel layer 130 may include providing an initial substrate having a base substrate and a stacked channel material layer on the base substrate; forming a fin mask layer on the stacked channel material layer; and sequentially etching the stacked channel material layer and the initial substrate to remove a portion of the stacked channel material layer and a portion of the initial substrate. Thus, the semiconductor substrate 110, the fin 120 and the stacked channel layer 130 may be formed.

In one embodiment, after forming the semiconductor substrate 110, the fin 120 and the stacked channel layer 130, an isolation layer (not labeled) may be formed on the semiconductor substrate 110 between adjacent fins 120.

In one embodiment, the isolation layer may expose the sidewall surfaces of the stacked channel layer 130 and cover the sidewall surfaces of the fin 120. Thus, the top surface of the isolation layer may level with the top surface of the fin 120. In some embodiments, the isolation layer may expose the sidewall surfaces of the stacked channel layer and portions of the sidewall surfaces of the fin and cover portions of the sidewall surfaces of the fin; and the top surface of the isolation layer may be below the top surface of the fin.

The isolation layer may be used as the isolation structure of the semiconductor structure; and may provide electrical isolation function between adjacent devices and between adjacent fins.

In one embodiment, the isolation layer is made of silicon oxide. In some embodiments, the isolation layer may be made of other insulation material, such as silicon nitride, or silicon oxynitride, etc.

The process for forming the isolation layer may include forming an isolation material layer on the semiconductor substrate 110 exposed by the fin 120 and to cover the top surface of the stacked channel layer 130; and polishing and etching-back the isolation material layer to remove the portion of the isolation material higher than the top surface of the fin 120 to form the isolation layer.

In one embodiment, after forming the stacked channel layer 130, a dummy oxide layer (not shown) may be formed to cover the stacked channel layer 130. The dummy oxide layer may be used to protect the stacked channel layer 130.

Figure 6:
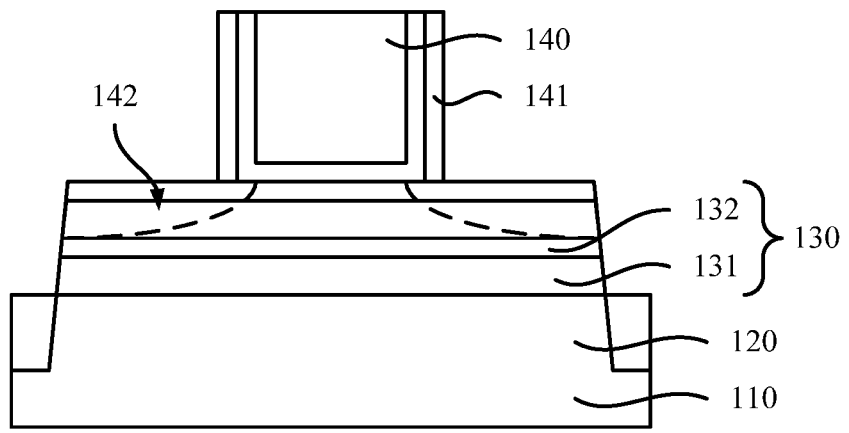

Returning to FIG. 17, after forming the dummy oxide layer, a dummy gate structure is formed (S102). FIG. 6 illustrates a corresponding semiconductor structure. FIG. 6 is a cross sectional view of the structure in FIG. 5 along a length direction of the fin 120.

As shown in FIG. 6, a dummy gate structure 140 is formed over the stacked channel layer 130. The dummy gate structure 140 may occupy a spatial space for subsequently forming an all-around gate structure.

In one embodiment, the top surface of the isolation layer may level with the top surface of the fin 120; and the isolation layer may expose the sidewall surfaces of the stacked channel layer 130. Thus, the dummy gate structure 140 may be across the stacked channel layer 130 and cover a portion of the top surface of the stacked channel layer 130 and portions of the sidewall surfaces of the stacked channel layer 130. In some embodiments, the isolation layer may only expose portions of the sidewall surfaces of the fin and may cover portions of the sidewall surfaces of the fin. Thus, the dummy gate structure may be across the stacked channel layer and the fin; and may cover portions of the sidewall surfaces of the stacked channel layer and portions of the sidewall surfaces of the fin.

Further, referring to FIG. 6, after forming the dummy gate structure 140, sidewall spacers 141 may be formed on the sidewall surfaces of the dummy gate structure 140. The sidewall spacers 141 may be used to protect the dummy gate structure and may also be used to define the positions of the subsequently formed doped source/drain regions.

In one embodiment, the sidewall spacers 141 is a single layer structure made of silicon nitride. In some embodiments, the sidewall spacers may be made of at least one of silicon oxide, silicon nitride, silicon carbide, silicon carbonitride, silicon carbonoxynitride, boron nitride and boron carbonitride, etc. In other embodiments, the sidewall spacers may be a multiple-layer stacked structure.

In one embodiment, one dummy gate structure 140 may be formed over the stacked channel layer 130. In some embodiments, a plurality of dummy gate structures may be formed over the stacked channel layer 130; and the plurality of dummy gate structures may be alternatively disposed.

Further, the dummy gate structure 140 may be formed on a portion of the middle of the stacked channel layer 130. Thus, the dummy gate structure 140 may be far away from the two ends of the stacked channel layer 130. When forming the dummy gate structure 140, mask gate structures (not shown) may be formed on the two ends of the stacked channel layer 130 so as to protect the two ends of the stacked channel layer 130 when subsequently forming the doped source/drain regions. Accordingly, the quality of the stress layer for forming the doped source/drain layer may be improved.

Further, as shown in FIG. 6, after forming the dummy gate structure 140, a lightly doping ion implantation process may be performed on the stacked channel layer 130 at both sides of the dummy gate structure 140 to form lightly doped regions 142. The lightly doped regions 142 may be used to form and keep shallow junctions to reduce the leakage current of the channel region.

In one embodiment, the sidewall spacers 141 may be formed on the sidewall surfaces of the dummy gate structure 140. The sidewall spacers 141 and the dummy gate structure 140 may be used as a mask when performing the lightly doping ion implantation process. The lightly doped regions 142 may be formed in the stacked channel layer 130 at both sides of the dummy gate structure 140 and may penetrate into the portions of the stacked channel layer 130 under the sidewall spacers 141.

In one embodiment, the semiconductor structure is a PMOS transistor, the ions of the lightly doping ion implantation process are P-type ions, such as B ions, or $BF_2$ ions, etc. The lightly doped regions 142 are P-type doped regions.

Figure 7:
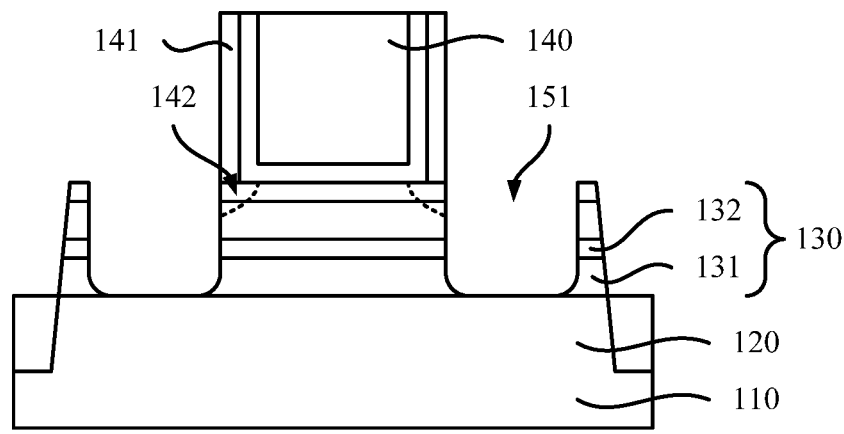

Returning to FIG. 17, after forming the lightly doped regions, openings may be formed in the stacked channel layer (S103). FIG. 7 illustrates a corresponding semiconductor structure.

As shown in FIG. 7, openings 151 are formed in the stacked channel layer 130 at both sides of the dummy gate structure 140. The openings 151 may provide a process space for subsequently forming a stress layer.

In one embodiment, the stacked channel layer 130 may include a sacrificial layer 131 made of SiGe and a channel layer made of Si. Thus, portions of the channel layer 130 at two sides of the dummy gate structure 140 may be removed by a dry etching process using the dummy gate structure 140 as an etching mask until the fin 120 is exposed to form the openings 151.

The openings 151 may expose the top surface of the fin 120 so as to prevent a punch-through between the subsequently formed source/drain regions. The openings 151 may expose the sidewall surfaces of the stacked channel layer 130. In particular, the openings 151 may expose the sidewall surfaces of the sacrificial layer 131 and the channel layer 132. Exposing the sidewall surfaces of the channel layer 132 may enable the sidewall surfaces of the channel layer 132 to contact with the subsequently formed stress layer. Accordingly, connections between the channel layer 132 and the subsequently formed doped source/drain regions may be formed.

The lightly doped regions 142 may be formed in the stacked channel layer 130 at both sides of the dummy gate structure 140 and the lightly doped regions 142 may penetrate into the portions of the stacked channel layer 130 under the sidewall spacers 141. Thus, portions of the lightly doped regions 142 may be left in the portions of the stacked channel layer 130 under the sidewall spacers 141 to suppress the leakage current in the channel.

Further, referring to FIG. 7, in one embodiment, the dummy gate structure 140 may be formed on the middle portion of the stacked channel layer 130; and mask gate structures (not shown) may be formed on two ends of the stacked channel layer 130. Thus, the dummy gate structure 140 and the mask gate structures may be alternatively disposed. When forming the openings 151, the dummy gate structure 140 and the mask gate structures may be used as a mask to etch the stacked channel layer 130. Thus, the openings 151 may be formed between the dummy gate structure 140 and the mask gate structures.

In some embodiments, a plurality of dummy gate structures may be disposed on the stacked channel layer alternatively. When forming the openings, the plurality of the dummy gate structures may be used as an etching mask to etch the stacked channel layer. Thus, the openings may be formed between adjacent dummy gate structures.

Figure 8:
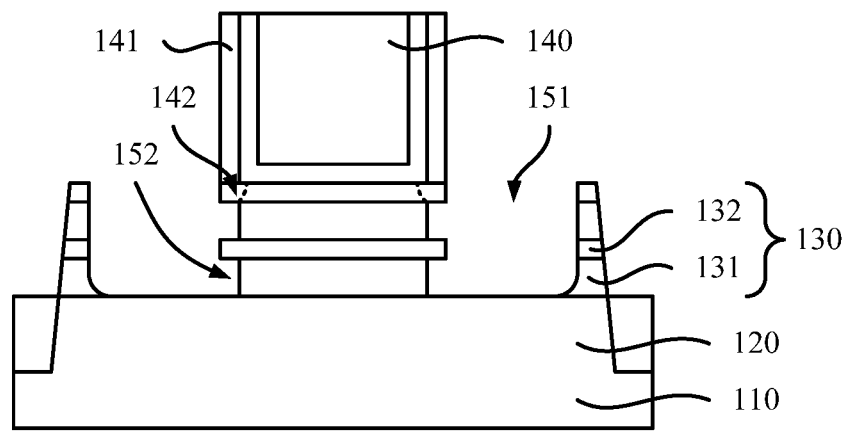

Returning to FIG. 17, after forming the openings, grooves may be formed in the stacked channel layer (S104). FIG. 8 illustrates a corresponding semiconductor structure.

As shown in FIG. 8, portions of the sacrificial layer 131 under the dummy gate structure 140 may be removed; and grooves 152 may be formed on the sidewalls of the openings 151. The grooves 152 may provide process spaces for subsequently forming a protective layer.

Further, as shown in FIG. 8, the portions of the sacrificial layer 131 may be removed along a direction perpendicular to the sidewall surfaces of the opening 151 adjacent to the dummy gate structure 140 and directing to the portions under the dummy gate structure 140. Thus, the grooves 152 may be formed on the sidewall surfaces of the openings 152 adjacent the to the dummy gate structure 140.

In one embodiment, the sidewall spacers 141 may be formed on the sidewall surfaces of the dummy gate structure 140. Thus, the depth of the grooves 152 may be smaller than, or equal to the thickness of the sidewall spacers 141. That is, along the extending (length) direction of the fin 120, the size of the grooves 152 may be smaller than, or equal to the size of the sidewall spacer 141. By controlling the depth of the grooves 152, the effects of the subsequent processes to the channel of the semiconductor structure may be reduced; and the damages to the channel may be prevented.

Further, in one embodiment, portions of the lightly doped regions 142 may be left in the portions of the stacked channel layer 130 under the dummy gate structure 140. Thus, the depth of the grooves 152 may be smaller than the diffusion length of the ions in the lightly doped regions 142. That is, along the length direction of the fin 120, the size of the grooves 152 may be smaller than the size of the lightly doped regions 142. Because the channel of the semiconductor structure may be between two lightly doped regions 142, the size of the grooves 152 being smaller than the size of the lightly doped regions 142 may be able to reduce the effect of the grooves 152 to the channel of the semiconductor structure; and the damages to the channel may be reduced.

In one embodiment, the sacrificial layer 131 is made of SiGe. Thus, the portion of the sacrificial layer 131 under the dummy gate structure 140 may be removed by a wet etching process to form the grooves 152 on the sidewall surfaces of the openings 151.

Figure 9:
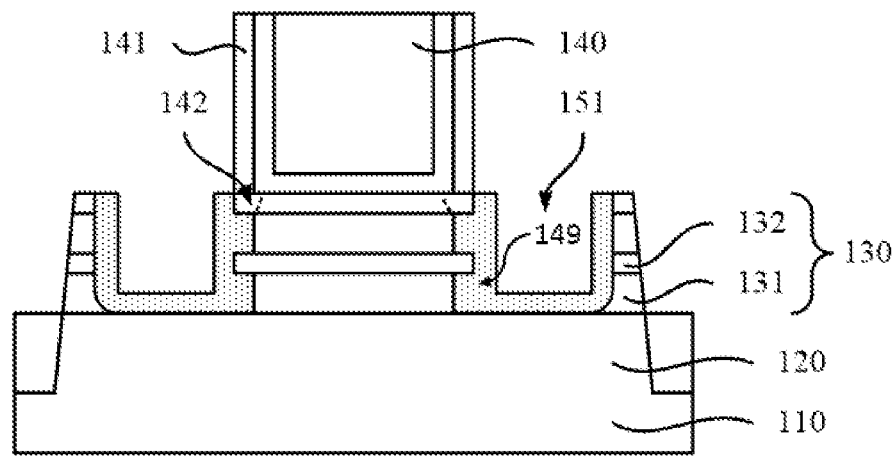

Returning to FIG. 17, after forming the grooves, a protective material layer may be formed (S106). FIG. 9 illustrates a corresponding semiconductor structure.

As shown in FIG. 9, a protective material layer 149 is formed in the openings 151. The protective material layer 149 may at least fill the grooves 152. The protective material layer 149 may provide a process base for subsequently forming a protective layer.

The protective material layer 149 may be made of any appropriate material. In one embodiment, the protective material layer 149 is made of Si.

Various processes may be used to form the protective material layer 149. In one embodiment, the protective material layer 149 is formed by an epitaxial growth process. The quality of the protective material layer 149 formed by the epitaxial growth process may be as desired; and may improve the quality of the subsequently formed protective layer. Improving the quality of the subsequently formed protective layer may facilitate to improve the property of the channel of the semiconductor structure. Accordingly, the performance of the semiconductor structure may be improved.

Because the protective material layer 149 may be formed by an epitaxial growth process, in one embodiment, the protective material layer 149 may fill the grooves 152 and extend to the sidewall surfaces of the openings 151 and the bottom surfaces of the openings 151. That is, the protective material layer 149 may be formed on the sidewall surfaces of the openings 151 adjacent to the dummy gate structure 140, the sidewall surfaces of the openings 151 far away from the dummy gate structure 140 and the bottom surfaces of the openings 151. Thus, the protective material layer 149 may be able to fill the openings 151 to entirely cover the sidewall surfaces of the sacrificial layer 131 to improve the protection ability to the stress layer.

Figure 10:
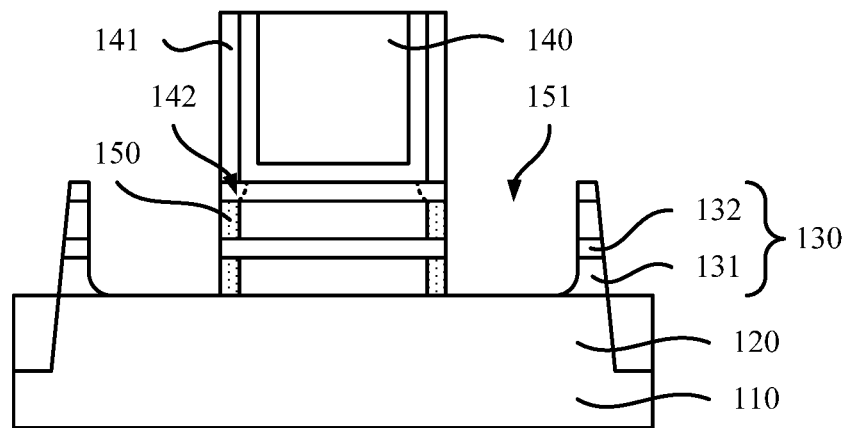

Returning to FIG. 17, after forming the protective material layer, a protective layer may be formed (S106). FIG. 10 illustrates a corresponding semiconductor structure.

As shown in FIG. 10, a protective layer 150 is formed in the grooves 152. The protective layer 150 may cover the sidewall surfaces of the sacrificial layer 131 and fill the grooves 152 to isolate the sacrificial layer 131 from the subsequently formed stress layer. The protective layer 150 may be able to avoid the damages to the sidewall surfaces of the stress layer caused by being exposed when subsequently removing the sacrificial layer 131. Thus, the stress layer may be protected; and the effect of the process for removing the sacrificial layer 131 to the stress layer may be effectively reduced; and the damages to the stress layer may be reduced. Accordingly, the quality of the stress layer may be improved; and the performance of the semiconductor structure may be enhanced.

In one embodiment, the protective layer 150 is made of Si. Because the sacrificial layer 131 may be made of SiGe, selecting Si as the material of the protective layer 150 may obtain a substantially large etching selectivity when the subsequent processes. Thus, the protection ability of the protective layer 150 may be effectively increased; and the damages to the subsequently formed stress layer may be reduced. Further, Si may have a desired compatibility with the semiconductor structure; and may be able to reduce the effect of the protective layer 150 to the performance of the semiconductor structure. Thus, when the performance of the semiconductor structure is improved, the adverse side effects may be reduced.

In one embodiment, the width of the protective layer 150 may be in a range of approximately 10 Å-300 Å. That is, along the length direction of the fin 120, the size of the protective layer 150 may be in a range of approximately 10 Å-300 Å.

If the width of the protective layer 150 is too small, the protection ability to the stress layer when subsequently removing the sacrificial layer 131 may be reduced; and the protective layer 150 may be unable to effectively reduce the damages to the stress layer; and it may not facilitate to improve the performance of the semiconductor structure. If the width of the protective layer 150 is too large, the effect of the protective layer 150 to the channel region of the semiconductor structure may be increased; and the electrical issues, such as the degrading of the performance of the channel region, etc., may occur; and it may not facilitate to increase the performance of the semiconductor structure.

The protective layer 150 may be formed by removing portions of the protective material layer 149 (referring to FIG. 9) and keeping the portions of the protective material layer 149 inside the grooves 152.

In one embodiment, when removing the portions of the protective material layer 149, the dummy gate structure 140 may be used as a mask and a dry etching process may be used to remove portions of the protective material layer 149 to form the protective layer 150. Thus, the portions of the protective material layer 149 inside the grooves 152 may be under the dummy gate structure 140. Accordingly, the portions of the protective material layer 149 inside the grooves 152 may be kept by the protection of the dummy gate structure 140; and the protective layer 150 may only be formed inside the grooves 152. Forming the protective layer 150 only inside the grooves 152 may effectively increase the volumes of the openings 151. Thus, the volume of the stress layer subsequently formed in the openings 151 may be increased; and the performance of the semiconductor structure may be improved.

Figure 11:
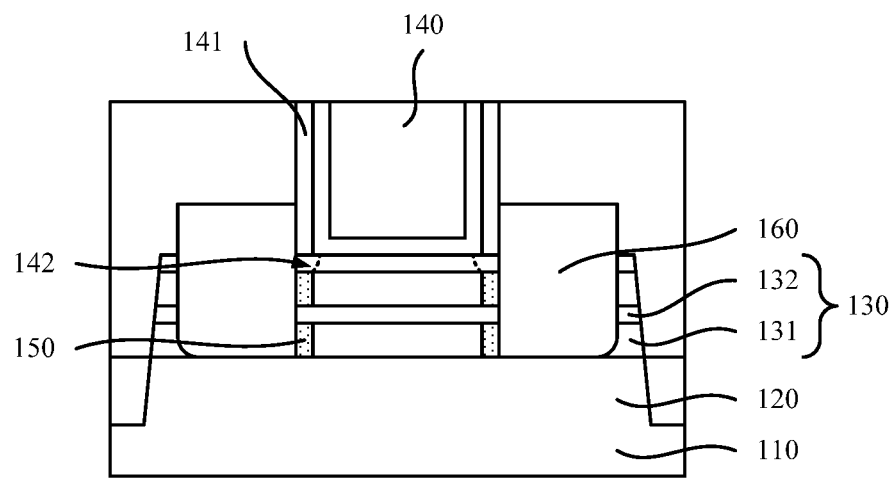

Returning to FIG. 17, after forming the protective layer, a stress layer may be formed in the openings (S107). FIG. 11 illustrates a corresponding semiconductor structure.

As shown in FIG. 11, a stress layer 160 is formed in the openings 151 (referring to FIG. 10). The stress layer 160 may be a doped stress layer; and may be used as a portion of the doped source/drain regions of the semiconductor structure. The doped stress layer 160 may be able to increase the carrier mobility of the channel region of the semiconductor structure.

In one embodiment, the semiconductor structure is a PMOS transistor, the stress layer 160 may be P-type doped stress layer. The stress layer 160 may be made of SiGe or Si, etc. The ions doped into the stress layer 160 may be P-type ions, such as B ions, Ga ions, or In ions. etc.

In some embodiments, the semiconductor structure may be an NMOS transistor. The stress layer may be an N-type doped stress layer. The stress layer may be made of SiC or Si, etc. The ions doped into the stress layer may be N-type ions, such as P ions, As ions, or Sb ions, etc.

Because the protective layer 150 may be formed in the sidewall surfaces of the openings 151 corresponding to the position of the sacrificial layer 131, the sidewall surfaces of the stress layer 160 may contact with the side surfaces of the channel layer 132 and the protective layer 150. The channel layer 132 may be fixed on the stress layer 160 through the sidewall surfaces. The protective layer 150 may be between the sacrificial layer 131 and the stress layer 160.

Further, referring to FIG. 11, after forming the stress layer 160, an interlayer dielectric layer (not labeled) may be formed on the surface of the semiconductor substrate 110 between adjacent dummy gate structures 140. The interlayer dielectric layer may be used to electrically isolate adjacent semiconductor structures. In one embodiment, the interlayer dielectric layer may expose the top surfaces of the dummy gate structure 140. Thus, the interlayer dielectric layer may also be used to define the size and the position of the subsequently formed all-around gate structure.

In one embodiment, the interlayer dielectric layer is made silicon oxide. In some embodiments, the interlayer dielectric layer may be made of silicon nitride, silicon oxynitride, or other dielectric material. The method for forming the interlayer dielectric layer may refer to the existing methods.

Figure 12:
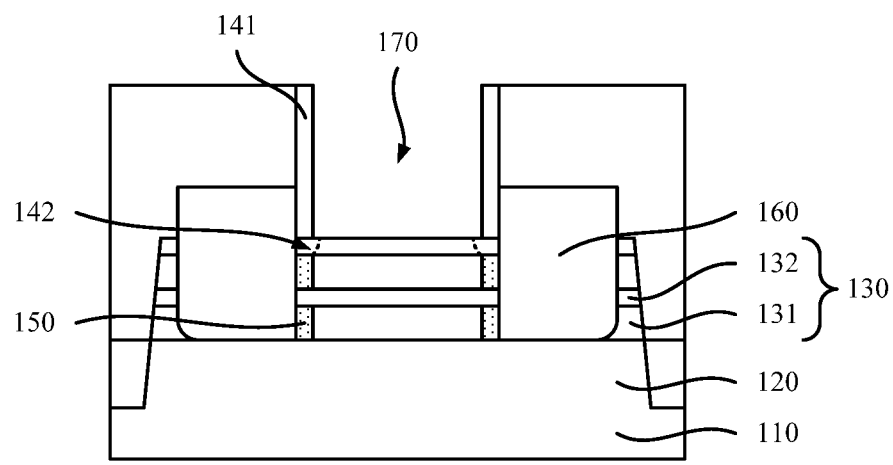

Returning to FIG. 17, after forming the interlayer dielectric layer, the dummy gate structure may be removed to form a gate opening (S108). FIG. 12 illustrates a corresponding semiconductor structure.

As shown in FIG. 12, after forming the stress layer 160, the dummy gate structure 140 is removed; and a gate opening 170 may be formed. The gate opening 170 may expose a portion of the top surface of the stacked channel layer 130 and portions of the sidewall surfaces of the stacked channel layer 130.

The gate opening 170 may be used to subsequently remove the sacrificial layer 131 to provide a process base for subsequently forming an all-around gate structure.

In one embodiment, the dummy gate structure 140 may cover a portion of the top surface of the stacked channel layer 130 and the portions of the sidewall surfaces of the stacked channel layer 130. Thus, the bottom of the gate opening 170 may expose the portion of the top surface of the stacked channel layer 130 and the portions of the sidewall surfaces of the stacked channel layer 130.

In some embodiments, the dummy gate structure may expose a portion of the top surface of the stacked channel layer and portions of the sidewall surfaces of the stacked channel layer and may extend portions of the sidewall surfaces of the fin. Thus, the bottom of the gate opening may expose the portion of the top surface of the stacked channel layer and the portions of the sidewall surfaces of the stacked channel layer and the portions of the sidewall surfaces of the fin.

In one embodiment, the interlayer dielectric layer (not labeled) may be formed on the semiconductor substrate 110 between adjacent dummy gate structures 140. Thus, after removing the dummy gate structures 140, the gate opening 170 may be located in the interlayer dielectric layer.

Figure 13:
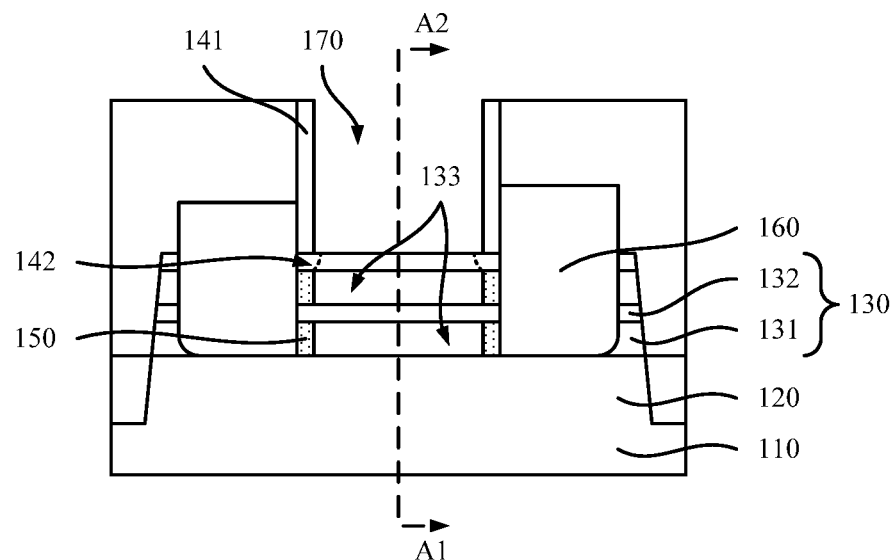
Figure 14:
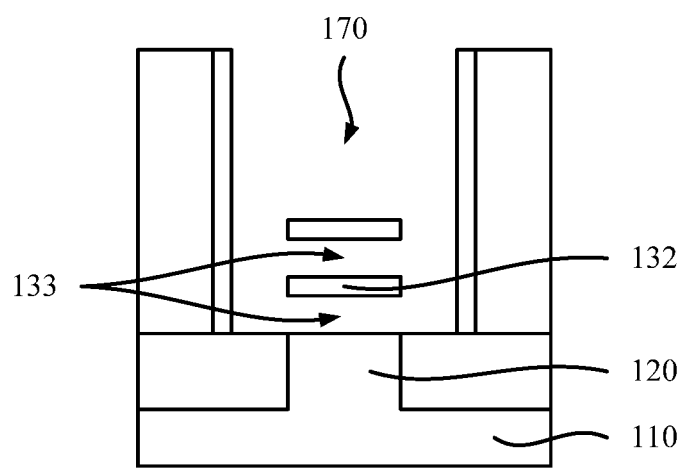

Returning to FIG. 17, after forming the gate opening, the sacrificial layer exposed by the gate opening may be removed (S109). FIGS. 13-14 illustrate a corresponding semiconductor structure. FIG. 14 is a cross-sectional version of the structure in FIG. 13 along an A1-A2 direction.

As shown in FIGS. 13-14, the portions of the sacrificial layer 131 exposed by the gate opening 170 may be removed; and a gap 133 may be formed under the channel layer 132. In one embodiment, two channel layers 132 are described. Thus, two gaps 133 are alternatively formed with the two channel layers 132. After forming the gaps 133, the channel layers 132 may be suspended. Accordingly, a process base may be provided for subsequently forming an all-around gate structure to surround the channel layer 132 from all around.

Because the protective layer 150 may be formed between the sacrificial layer 131 and the stress layer 160, after removing the sacrificial layer 131, the protective layer 150 may cover the sidewall surfaces of the stress layer 160. Thus, the stress layer 160 may be prevented from being exposed through the gaps 133. Accordingly, the damage to the stress layer 160 when removing the sacrificial layer 131 may be effectively avoided. That is, the possible damages to the stress layer 160 may be reduced; and the performance of the semiconductor structure may be improved.

In one embodiment, when removing the sacrificial layer 131 exposed in the gate opening 170, the etching rate of the sacrificial layer 131 may be greater than the etching rage of the protective layer 150. Thus, the width of the protective layer 150 may be effectively reduced; and the protective ability of the protective layer 150 to the stress layer 160 may be improved; and the damages to the stress layer 160 may be reduced.

Furthermore, the sacrificial layer 131 may be removed after forming the stress layer 150 (as shown in FIG. 6). Thus, after removing the sacrificial layer 131, the two ends of the channel layer 132 may connect to the stress layer 150; and the channel layer 131 may be suspended in the gate opening 170.

In one embodiment, two stacked channel layers 130 may be formed on the fin 120. Thus, when the process for removing the sacrificial layer 131, after removing the sacrificial layer 131 in the two stacked channel layers 130, a gap 133 may be formed under the channel layer 132 of each of the two stacked channel layers 130.

Various processes may be used to remove the sacrificial layer 131 exposed by the gate opening 170. In one embodiment, a wet etching process is used to remove the sacrificial layer 131 exposed by the gate opening 170 to reduce the damages to the channel layer 132 caused by the process for removing the sacrificial layer 131. Thus, the yield may be increased; and the performance of the device may be improved. In particular, when removing the sacrificial layer 131 exposed by the gate opening 170, the etching rate to the sacrificial layer 131 may be greater than the etching rate to the channel layer 132.

In one embodiment, the channel layer 132 is made of Si; and the sacrificial layer 131 is made SiGe. Thus, when removing the sacrificial layer 131, a HCl vapor may be used to perform a wet etching process. The concentration of HCl in the HCl vapor may be in a range of approximately 20%-90%. The difference between the etching rate of HCl to SiGe and the etching rate of HCl to Si may be substantially large. Thus, using the HCl vapor to remove the sacrificial layer 131 may be effectively reduce the possibility for damaging the channel layer 132. Accordingly, the yield may be increased; and the performance of the semiconductor structure may be improved.

Returning to FIG. 17, after removing the sacrificial layer to form the gap, an all-around gate structure may be formed (S110). FIGS. 15-16 illustrate a corresponding semiconductor structure. FIG. 15 is based on the structure in FIG. 13; and FIG. 16 is based on the structure in FIG. 14.

As shown in FIGS. 15-16, an all-around gate structure 180 is formed. The all-around gate structure 180 may fill the gate opening 170 (referring to FIG. 13). The gate opening 170 may connect with the gap 133. Thus, the all-around gate structure 180 may fill the gap 133 between the channel layer 132 and the isolation layer. Thus, the all-around gate structure 180 may surround the channel layer 132. In particular, the all-around gate structure 180 may be able to cover the top surface, the bottom surface and the sidewall surfaces channel layer 132.

In one embodiment, the number of the channel layers 132 is two; and a gap 133 may be formed under each of the two channel layers 132. Thus, the all-around gate structure 180 may fill the gaps 133 under the two channel layers 132. In particular, the all-around gate structure 180 may surround the two channel layers 132.

The all-around gate structure 180 may be any appropriate type of gate structure. In one embodiment, the all-around gate structure is a metal gate structure. The all-around gate structure may include a gate dielectric layer (not shown) and a gate electrode on the gate dielectric layer.

The process for forming the all-around gate structure 180 may include forming a gate dielectric layer in the gate opening 170. The gate dielectric layer may cover the bottom and the sidewall surfaces of the gate opening 170, and may also cover the surfaces of the channel layer 132 suspended in the gate opening 180. After forming the gate dielectric layer, a metal material may be filled in the gate opening 170 to form the gate electrode.

The gate dielectric layer may be used to electrically isolate adjacent channels.

Because the channel of the semiconductor structure may be in the channel layer 132, the gate dielectric layer may cover all the surfaces of the channel layer 132 in the gate opening 170. In particular, the gate dielectric layer may cover the top surface, the bottom surface and the sidewall surfaces of the channel layer 132 in the gate opening 170.

The gate dielectric layer may be made of a high dielectric constant (high-K) dielectric material. The high-K dielectric material may refer to the dielectric material having a relative dielectric constant greater than the relative dielectric constant of silicon oxide. In one embodiment, the gate dielectric layer is made of $HfO_2$. In some embodiments, the gate dielectric layer may be made of $ZrO_2$, HfSiO, HfSiON, HfTaO, HfTiO, HfZrO, or $Al_2O_3$, etc.

The gate dielectric layer may be formed by an atomic layer deposition (ALD) process. In some embodiments, the gate dielectric layer may be formed by a deposition method, such as a chemical vapor deposition (CVD) process, or a physical vapor (PVD) process, etc.

The metal gate may be used as an electrode to form an electrical connection with external circuits.

In one embodiment, the metal gate is made of W. In some embodiments, the metal gate may be made of Al, Cu, Ag, Au, Pt, Ni, or Ti, etc.

The present disclosure also provides a semiconductor structure. FIG. 10 illustrates an exemplary semiconductor structure consistent with various disclosed embodiments.

As shown in FIG. 10, the semiconductor structure may include a semiconductor substrate 110, at least one fin 120 on the semiconductor substrate 111, and a stacked channel layer 130 on the fin 120. The stacked channel layer 130 may include a sacrificial layer 131 on the fin 120 and a channel layer 132 on the sacrificial layer 131. The semiconductor structure may also include a dummy gate structure 140 on the stacked channel layer 130; openings 151 in the stacked channel layer 130 at both sides of the stacked channel layer 130; and a protective layer 150 on the sidewall surfaces of the sacrificial layer 131 under the dummy gate structure 140.

After subsequently forming a stress layer in the openings 151, the protective layer 150 may be between the sacrificial layer 131 and the stress layer. Thus, the protective layer 150 may prevent the sidewall surfaces of the stress layer from being exposed when subsequently removing the sacrificial layer 131. Thus, the stress layer may be protected; and the damages to stress layer may be prevented. Accordingly, the quality of the stress layer may be improved; and the performance of the semiconductor structure may be improved.

The semiconductor substrate 110 and the fin 120 may provide a process platform for subsequently forming the semiconductor structure. The stacked channel layer 130 may provide a process base for subsequently forming a suspended channel layer. The sacrificial layer 131 may provide a spatial space for subsequently forming an all-around gate structure. The channel of the semiconductor structure may be formed in the channel layer 132.

In one embodiment, the semiconductor structure may be a PMOS transistor. In some embodiments, the semiconductor structure may be an NMOS transistor.

In one embodiment, the semiconductor substrate 110 is made of single crystal silicon. In some embodiments, the semiconductor substrate may be made of polysilicon, amorphous silicon, amorphous germanium, germanium, silicon germanium, silicon carbide, gallium arsenide, or gallium indium, etc. In other embodiments, the semiconductor substrate may be a silicon on insulator (SOI) substrate, a germanium on insulator (GOI) substrate, or a glass substrate, etc. The material of the semiconductor substrate may be a material that meets the process requirements and is easy to be integrated.

In one embodiment, the fin 120 and the semiconductor substrate 110 are made of a same material: single crystal silicon. In some embodiments, the fin and the semiconductor substrate may be made of different materials. The fin may be made of other appropriate semiconductor material, such as silicon, germanium, silicon germanium, or silicon carbide, gallium arsenide, or gallium indium, etc.

The sacrificial layer 131 may be made of any appropriate material. In one embodiment, the sacrificial layer 131 is made of SiGe; and the channel layer 132 may be made of SiGe. Because the etching selectivity ratio between Si and SiGe may be substantially large, the damage to the channel layer 132 when subsequently removing the sacrificial layer 131 may be effectively reduced. Accordingly, the performance of the semiconductor structure may be improved.

In one embodiment, two stacked channel layers 130 may be formed on the fin 120. That is, two sacrificial layers 131 and two channel layers 132 may be alternatively formed on the fin 120.

In one embodiment, the semiconductor structure may also include an isolation layer (not labeled). The isolation layer may be formed on the semiconductor substrate 110 between adjacent fins 120.

In one embodiment, the isolation layer may expose the sidewall surfaces of the stacked channel layer 130 and cover the sidewall surfaces of the fin 120. Thus, the top surface of the isolation layer may level with the top surface of the fin 120. In some embodiments, the isolation layer may expose the sidewall surfaces of the stacked channel layer and portions of the sidewall surfaces of the fin and cover portions of the sidewall surfaces of the fin; and the top surface of the isolation layer may be below the top surface of the fin.

The dummy gate structure 140 may occupy a spatial space for subsequently forming an all-around gate structure.

In one embodiment, the top surface of the isolation layer may level with the top surface of the fin 120; and the isolation layer may expose the sidewall surfaces of the stacked channel layer 130. Thus, the dummy gate structure 140 may be across the stacked channel layer 130 and cover a portion of the top surface of the stacked channel layer 130 and portions of the sidewall surfaces of the stacked channel layer 130. In some embodiments, the isolation layer may only expose portions of the sidewall surfaces of the fin and may cover portions of the sidewall surfaces of the fin. Thus, the dummy gate structure may be across the stacked channel layer and the fin and may cover portions of the sidewall surfaces of the stacked channel layer and portions of the sidewall surfaces of the fin.

Further, as shown in in FIG. 10, sidewall spacers 141 may be formed on the sidewall surfaces of the dummy gate structure 140. The sidewall spacers 141 may be used to protect the dummy gate structure 140 and may also be used to define the positions of the subsequently formed doped source/drain regions.

In one embodiment, the sidewall spacers 141 is a single layer structure made of silicon nitride. In some embodiments, the sidewall spacers may be made of a material including at least one of silicon oxide, silicon nitride, silicon carbide, silicon carbonitride, silicon carbonoxynitride, boron nitride and boron carbonitride, etc. In other embodiments, the sidewall spacers may be a multiple-layer stacked structure.

In one embodiment, one dummy gate structure 140 may be formed over the stacked channel layer 130. In some embodiments, a plurality of dummy gate structures may be formed over the stacked channel layer; and the plurality of dummy gate structures may be alternatively disposed.

Further, the semiconductor structure may include lightly doped regions 142 formed in the stacked channel layer 130 at both sides of the dummy gate structure 140. The lightly doped regions 142 may be used to form and keep shallow junctions to reduce the leakage current of the channel region.

In one embodiment, the sidewall spacers 141 may be formed on the sidewall surfaces of the dummy gate structure 140. The lightly doped regions 142 may be formed in portions of the stacked channel layer 130 under the sidewall spacers 141.

In one embodiment, the semiconductor structure is a PMOS transistor, the lightly-doped regions are P-type doped; and the doping ions are P-type ions, such as B ions, or BF2 ions, etc.

The openings 151 may provide a process space for subsequently forming a stress layer.

In one embodiment, the openings 151 may be formed in the stacked channel layer 130 at both sides of the dummy gate structure 140. The openings 151 may expose the top surface of the fin 120 so as to prevent a punch-through between the subsequently formed source/drain regions. The sidewall surfaces of the openings 151 may expose the sidewall surfaces of the channel layer 132. Exposing the sidewall surfaces of the channel layer 132 may enable to the sidewall surfaces of the channel layer 132 to contact with the subsequently formed stress layer. Accordingly, electrical connections between the channel layer 132 and the subsequently formed doped source/drain regions may be formed.

The protective layer 150 may cover the sidewall surfaces of the sacrificial layer 131; and may isolate the sacrificial layer 131 from the subsequently formed stress layer. The protective layer 150 may be able to avoid the damages to the sidewall surfaces of the stress layer caused by being exposed when subsequently removing the sacrificial layer 131. Thus, the stress layer may be protected; and the effect of the process for removing the sacrificial layer 131 to the stress layer may be effectively reduced; and the damages to the stress layer may be reduced. Accordingly, the quality of the stress layer may be improved; and the performance of the semiconductor structure may be enhanced.

The material of the protective layer 150 may be selected from the material having a smaller etching rate than the sacrificial layer 131 when subsequently removing the sacrificial layer 131 so as to ensure the protection ability of the protective layer 150 to the subsequently formed stress layer when removing the sacrificial layer 131.

In one embodiment, the protective layer 150 is made of Si. Because the sacrificial layer 131 may be made of SiGe, selecting Si as the material of the protective layer 150 may obtain a substantially large etching selectivity when the subsequent processes. Thus, the protection ability of the protective layer 150 may be effectively increased; and the damages to the subsequently formed stress layer may be reduced. Further, Si may have a desired compatibility with the semiconductor structure; and may be able to reduce the effect of the protective layer 150 to the performance of the semiconductor structure. Thus, when the performance of the semiconductor structure is improved, the adverse side effects may be reduced.

In one embodiment, the sidewall spacers 141 may be formed on the sidewall surfaces of the dummy gate structure 140. Thus, the protective layer 150 may be under the sidewall spacers 141; and the width of the protective layer 150 may be smaller than, or equal to the thickness of the sidewall spacers 141. That is, along the length direction of the fin 120, the size of the protective layer 150 may be smaller than, or equal to the size of the sidewall spacers 141. By controlling the width of the protective layer 150, the effect of the subsequent process to the channel region of the semiconductor structure may be reduced; and the damages to channel region may be prevented.

In one embodiment, the lightly doped regions 142 may be formed in the stacked channel layer 130 under the dummy gate structure 140. Thus, the width of the protective layer 150 may be smaller than the diffusion width of the doping ions in the lightly doped regions 142. That is, along the length direction of the fin 120, the size of the protective layer 150 may be smaller than the size of the lightly doped regions 142. Because the channel of the semiconductor structure may be located between two adjacent lightly doped regions 142, allowing the width of the protective layer 150 to be smaller than the diffusion width of the ions in the lightly doped regions 142 may be able to reduce to the effect of the protective layer 150 to the channel of the semiconductor structure. Thus, the damages to the channel may be reduced.

In one embodiment, the width of the protective layer 150 may be in a range of approximately 10 Å-300 Å. That is, along the length direction of the fin 120, the size of the protective layer 150 may be in a range of approximately 10 Å-300 Å.

If the width of the protective layer 150 is too small, the protection ability to the stress layer when subsequently removing the sacrificial layer 131 may be reduced; and the protective layer 150 may be unable to effectively reduce the damages to the stress layer; and it may not facilitate to improve the performance of the semiconductor structure. If the width of the protective layer 150 is too large, the effect of the protective layer 150 to the channel region of the semiconductor structure may be increased; and the electrical issues, such as the degrading of the performance of the channel region, etc., may occur; and it may not facilitate to increase the performance of the semiconductor structure.

Thus, in the disclosed embodiments, after forming the openings at both sides of the dummy gate structure, portions of the sacrificial layer under the dummy gate structure may be removed to form grooves on the sidewall surfaces of the openings. Then, a protective layer may be formed in the grooves. Because the grooves may be formed by removing portions of the sacrificial layer, the sidewall surfaces of the sacrificial layer may be exposed by the grooves; and the protective layer may be formed on the sidewall surfaces of the sacrificial layer. After subsequently forming a stress layer, the protective layer may be between the sacrificial layer and the stress layer. Thus, the protective layer may be able to prevent the sidewall surfaces of the stress layer from being exposed when removing the sacrificial layer; and the stress layer may be protected. Accordingly, the damages to the stress layer may be effectively reduced; the quality of the stress layer may be improved; and the performance of the semiconductor structure may be improved.

In one embodiment, after forming the dummy gate structure and before forming the openings, sidewall spacers may be formed on the sidewall surfaces of the dummy gate structure. When forming the grooves, the depth of the grooves may be smaller than the thickness of the sidewall spacers. By controlling the depth of the grooves, the effect of the process for forming the protective layer to the channel region under the dummy gate structure may be reduced; and the damages to the channel region may be prevented. Thus, under the condition of ensuring the quality of the channel region, the quality of the stress layer may be improved; and the performance of the semiconductor structure may be improved.

Further, in one embodiment, after forming the dummy gate structure and before forming the openings, a lightly doping ion implantation process may be performed to form lightly doped regions in the channel layer at two sides of the dummy gate structure. When the forming the grooves, the grooves may be formed in the lightly doped regions. Be limiting the positions of the grooves, the effect of the formation of the grooves to the channel region of the semiconductor structure may be effectively reduced; and the damages to the channel region may be prevented. Thus, under the condition of ensuring the quality of the channel region, the quality of the stress layer may be improved; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   at least one fin on a semiconductor substrate;
   at least one stacked channel layer formed on the at least one fin, each stacked channel layer having a sacrificial layer and a channel layer on the sacrificial layer;
   an all-around gate structure formed on the at least one stacked channel layer;
   lightly doped regions formed in the at least one stacked channel layer at both sides of the all-around gate structure;
   openings formed in the at least one stacked channel layer at both sides of the all-around gate structure;
   a protective layer formed on sidewall surfaces of each sacrificial layer, wherein each protective layer is sandwiched by adjacent channel layers and a topmost layer of the at least one stacked channel layer is a corresponding channel layer; and
   a stress layer formed in each of the openings covering a sidewall of the protective layer and a sidewall of the channel layer, wherein each of the sacrificial layer is divided by the protective layer and the stress layer into at least two sections.

2. The semiconductor structure according to claim 1, wherein:
   the protective layer is made of Si.

3. The semiconductor structure according to claim 1, wherein:
   a width of the protective layer is in a range of approximately 10 Å-300 Å.

4. The semiconductor structure according to claim 1, wherein:
   the semiconductor structure is a PMOS transistor.

5. The semiconductor structure according to claim 1, further comprising:
   sidewall spacers formed on sidewall surfaces of the all-around gate structure,
   wherein the protective layer is under the sidewall spacers and a width of the protective layer is smaller than or equal to a thickness of the sidewall spacers.

6. The semiconductor structure according to claim 1, further comprising:
   a stress layer formed in the openings.

7. The semiconductor structure according to claim 1, wherein:
   the sacrificial layer is made of SiGe; and
   the semiconductor structure is PMOS transistor.

8. The semiconductor structure according to claim 1, wherein:
   the protective layer has a sidewall surface coplanar with a sidewall surface of the sacrificial layer.

9. The semiconductor structure according to claim 8, wherein:

the openings expose the sidewall surface of the protective layer and the sidewall surface of the channel layer.

10. The semiconductor structure according to claim 1, wherein:
the protective layer completely covers sidewall surfaces of the channel layer directly under the all-around gate structure.

11. The semiconductor structure according to claim 1, wherein:
the lightly doped regions is located on a side of the openings close to the all-around gate structure.

12. The semiconductor structure according to claim 1, wherein:
the all-around gate structure is directly formed on a top channel layer of the at least one stacked channel layer.

13. The semiconductor structure according to claim 12, wherein:
the lightly doped regions are located within the top channel layer of the at least one stacked channel layer, and
the size of the lightly doped regions along the extending direction of the at least one fin is the diffusion length of doped ions into the top channel layer.

\* \* \* \* \*